United States Patent
Hsu

(10) Patent No.: US 7,855,424 B2
(45) Date of Patent: Dec. 21, 2010

(54) METHOD FOR PACKAGING SEMICONDUCTOR DEVICE AND PACKAGE STRUCTURE THEREOF

(75) Inventor: Chain-Hau Hsu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 899 days.

(21) Appl. No.: 11/606,085

(22) Filed: Nov. 30, 2006

(65) Prior Publication Data

US 2007/0126075 A1    Jun. 7, 2007

(30) Foreign Application Priority Data

Dec. 2, 2005    (TW) .............................. 94142663 A

(51) Int. Cl.
*H01L 21/00*    (2006.01)

(52) U.S. Cl. .................. 257/431; 257/432; 257/433; 257/434; 257/435; 438/116

(58) Field of Classification Search ......... 257/431–435; 438/116

See application file for complete search history.

(56) References Cited

U.S. PATENT DOCUMENTS

| 6,441,481 | B1* | 8/2002 | Karpman ................. 257/711 |
| 6,759,668 | B2* | 7/2004 | Matsuo et al. ............. 250/551 |
| 6,929,974 | B2* | 8/2005 | Ding et al. ................. 438/106 |
| 7,692,720 | B2* | 4/2010 | Nishida et al. ............. 348/374 |
| 2005/0236708 | A1* | 10/2005 | Farnworth et al. .......... 257/723 |
| 2006/0043512 | A1* | 3/2006 | Oliver et al. ............... 257/433 |

* cited by examiner

*Primary Examiner*—Matthew C Landau
*Assistant Examiner*—James M Mitchell
(74) *Attorney, Agent, or Firm*—Rabin & Berdo, P.C.

(57) ABSTRACT

A method for packaging a semiconductor device includes following steps. First, a first substrate including at least one first pattern is provided. At least one semiconductor device is disposed on the surface of the first substrate. Next, a spacer with at least one aperture and at least one through hole is provided. Then, the first pattern is aimed at the through hole to connect the first substrate and the spacer, so that the semiconductor device is positioned correspondingly to the aperture. Afterwards, a second substrate including at least one second pattern is provided. Thereon, the second pattern is aimed at the through hole, so that the second substrate is connected to the spacer correspondingly.

20 Claims, 5 Drawing Sheets

METHOD FOR PACKAGING SEMICONDUCTOR DEVICE AND PACKAGE STRUCTURE THEREOF

This application claims the benefit of Taiwan application Serial No. 94142663, filed Dec. 2, 2005, the subject matter of which is incorporated herein by reference.

BACKGROUND OF THE INVENTION

1. Field of the Invention

The invention relates in general to a packaging method and a package structure thereof, and more particularly to a method for packaging a semiconductor device and a package structure thereof.

2. Description of the Related Art

In the development of the projector, the technology has evolved from cathode ray tube (CRT), amorphous silicon (a-Si), polycrystalline silicon (P-Si) to digital micromirror device (DMD) and liquid crystal on silicon (LCOS) technology. With the progress of projection technology, the projector has become more and more popular because of its advantages such as small volume, light weight and easy portability. Besides, the laptop performance is continuously improved, and the sales volume of laptops increases significantly. As a result, multimedia presentation has become prevalent, and the projector is no longer just for office automation market. In the near future, the projector will reach not only the consumer electronic market but also the personal computer (PC) market. As the projection technology advances with each passing day, the projection chip is the most important device among all the semiconductor devices, such as some optical devices.

FIG. 1 illustrates a package structure of a projection chip. Please referring to FIG. 1, a projection chip 11 is disposed among a substrate 10, a spacer 12 and a glass substrate 13. As a result, light is able to pass through the glass substrate 13 to the projection chip 11, and the projection chip 11 is protected. When the projection chip 11 is packaged, the projection chip 11 is disposed on the substrate 10 first. Next, the spacer 12 is disposed around the projection chip 11. Then, the glass substrate 13 is disposed on the spacer 12. After the positioning process, the substrate 10, the spacer 12 and the glass substrate 13 are pressed together to package the projection chip 11.

However, the substrate 10, the spacer 12 and the glass substrate 13 cannot be positioned. In the conventional manufacture process, a charge coupled device (CCD) is often used for positioning. In the package structure of the projection chip 11, the gap between the substrate 10 and the glass substrate 13 is too large. Therefore, the charge coupled device cannot detect the reference points on the substrate 10 and the glass substrate 13 at the same time. As a result, the substrate 10, the spacer 12 and the glass substrate 13 are not positioned accurately. The following cutting process cannot be controlled when the substrate 10, the spacer 12 and the glass substrate 13 are not positioned well. Hence, the following manufacture process of the projection chip and the product yield are affected seriously.

SUMMARY OF THE INVENTION

It is therefore an object of the invention to provide a method for packaging a semiconductor device and a package structure thereof for improving the conventional problem that the positioning process cannot be accomplished by an image sensor. In the present invention, through holes are formed on a spacer, and corresponding patterns are formed on a first substrate and a second substrate respectively. As a result, the image sensor performs the automatic positioning process through the second substrate and the through holes. The positioning process is accomplished on the conventional machines. Therefore, there is no need to purchase new machines.

The invention achieves the above-identified object by providing a method for packaging a semiconductor device. First, a first substrate is provided. At least one semiconductor device is disposed on the surface of the first substrate. The first substrate includes at least one first pattern. Next, a spacer having at least one aperture and at least one through hole is provided. Then, the first pattern is aimed at the through hole to connect the spacer to the first substrate, so that the semiconductor device is disposed correspondingly to the aperture. Afterwards, a second substrate including at least one second pattern is provided. Later, the second pattern is aimed at the through hole to connect the second substrate to the spacer.

The invention achieves the above-identified object by providing a semiconductor package structure including a first substrate, a semiconductor device, a spacer, and a second substrate. The first substrate includes a first pattern. The semiconductor device is disposed on the first substrate. The spacer is connected to the first substrate by pressing together. The spacer has an aperture and a through hole. The aperture is aimed at the semiconductor device, and the first pattern is aimed at the through hole. The second substrate is connected to the spacer by pressing together and includes a second pattern aimed at the through hole.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
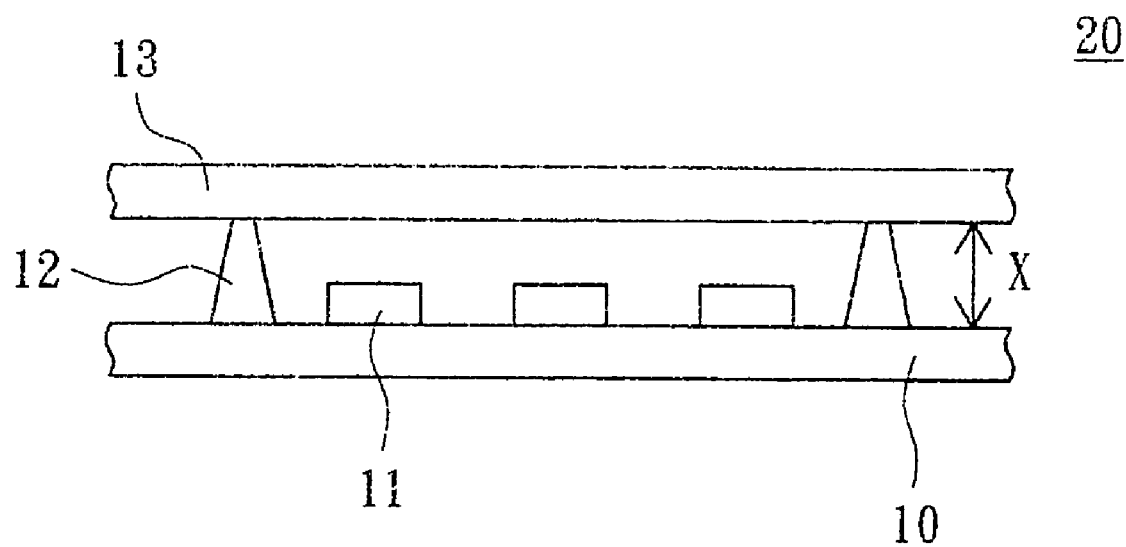
FIG. 1 illustrates a package structure of a projection chip.
Figure 2A:
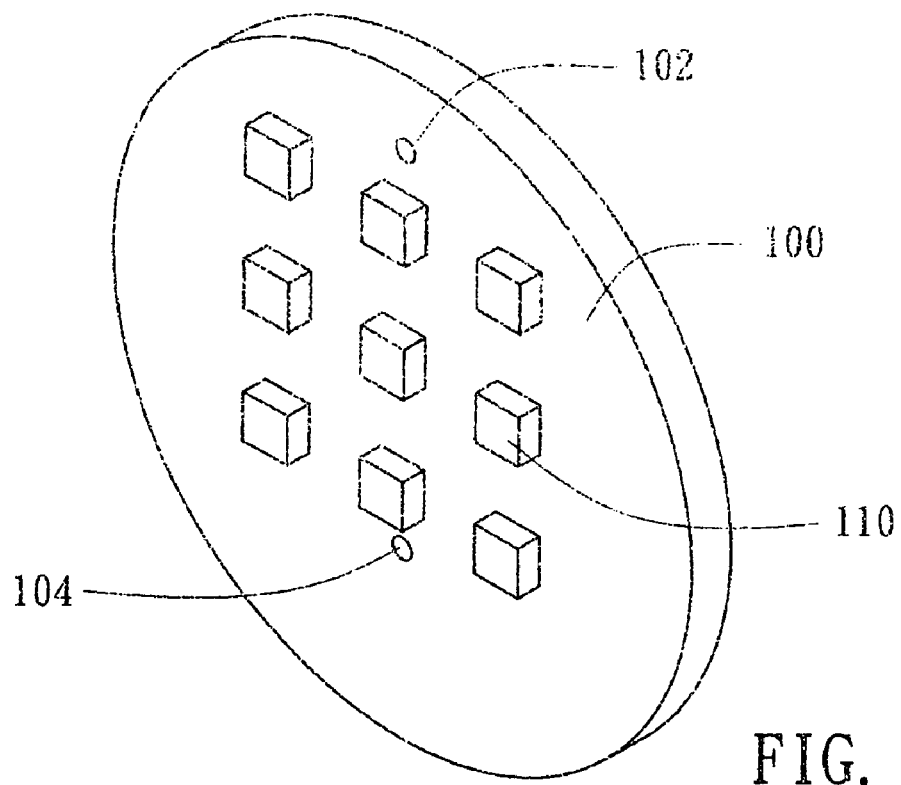
FIGS. 2A~2H illustrate a method for packaging an optical device according to a preferred embodiment of the present invention.
Figure 2B:
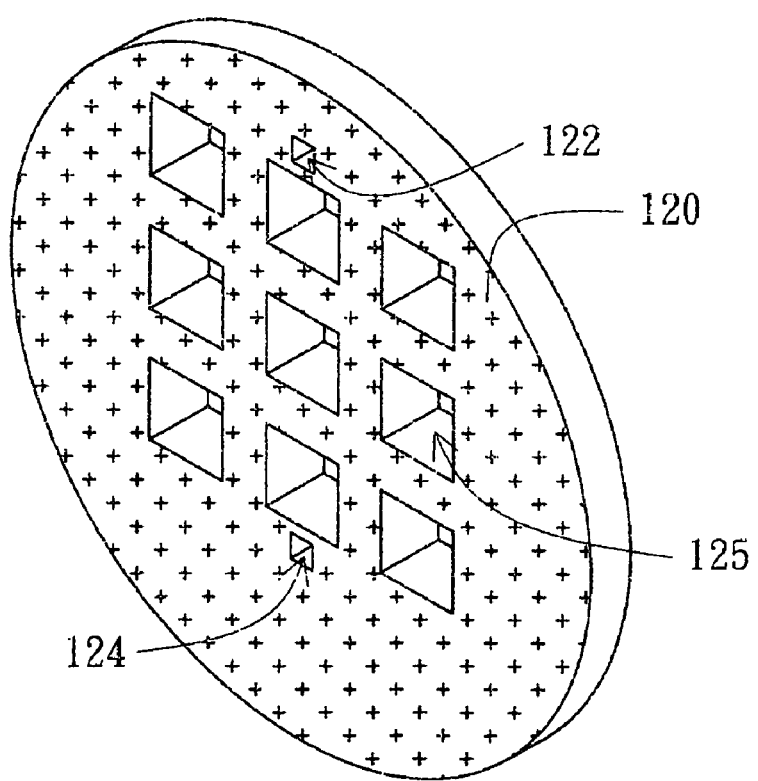

FIGS. 2A~2H illustrate a method for packaging a semiconductor device according to a preferred embodiment of the present invention. The method for packaging the semiconductor device, such as an optical device of the present embodiment includes following steps. First, as shown in FIG. 2A, a first substrate 100 is provided. Several optical devices 110 are disposed on the surface of the first substrate 100. The first substrate 100 includes at least one first pattern. For example, the first substrate 100 includes two first patterns 102 and 104. The first substrate 100 is preferably a CMOS wafer. Meanwhile, as shown in FIG. 2B, a spacer 120 is provided. The spacer 120 includes at least one aperture, such as several apertures 125, and at least one through hole, such as two through holes 122 and 124. The spacer 120 is preferably formed by etching a wafer. The forming process of the spacer 120 is described in detail as follow. First, a wafer is provided. Next, a patterned photoresist layer is formed on the wafer. Then, the wafer is etched to form at least one aperture, such as several apertures 125, and at least one through holes, such as two through holes 122 and 124 according to the patterned photoresist layer.

Figure 2C:
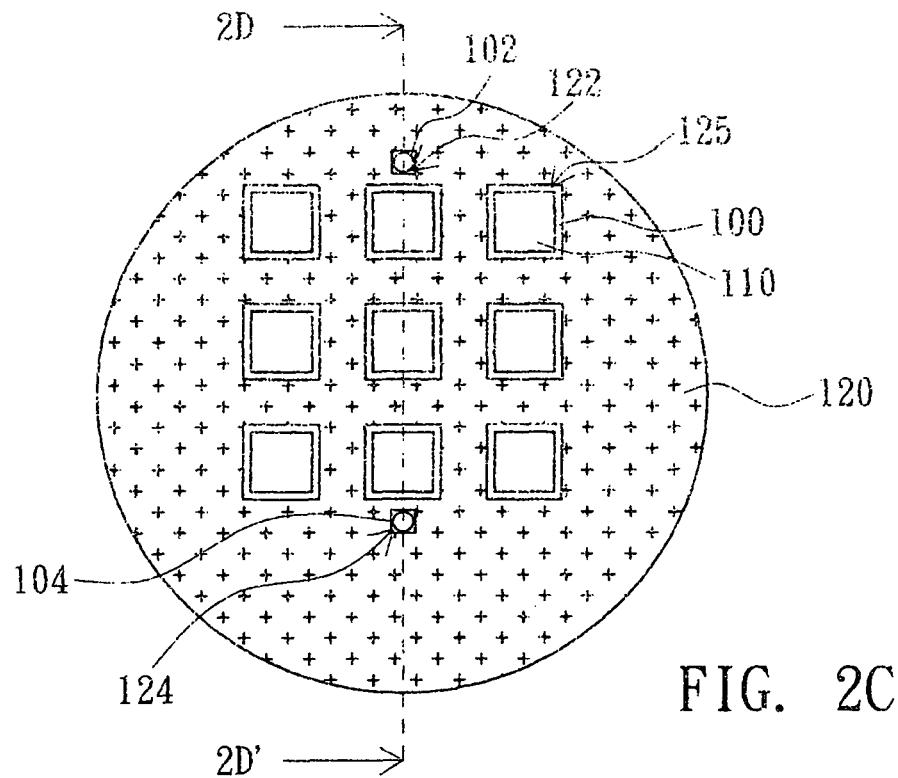
Figure 2D:
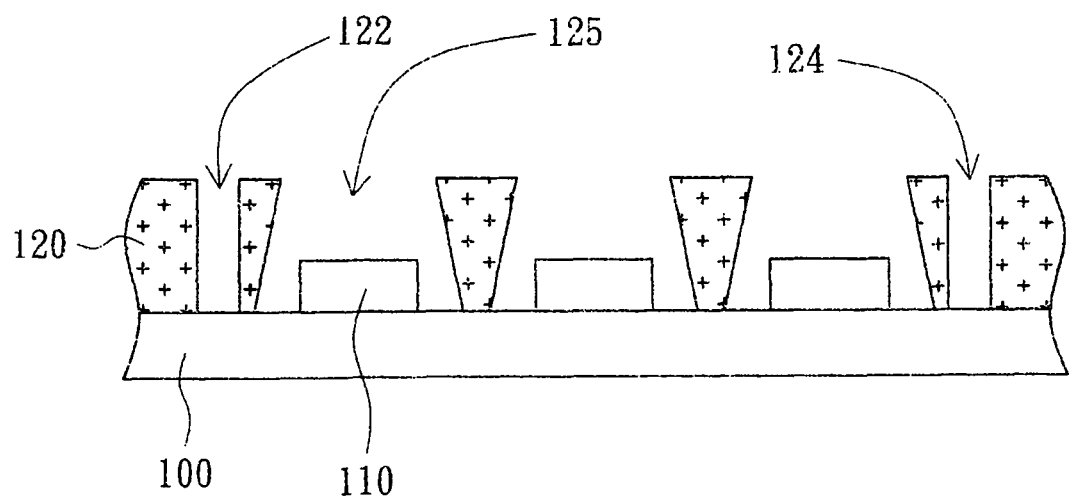

Thereon, the first patterns 102 and 104 are aimed at the through holes 122 and 124, so that the apertures 125 are aimed at the optical devices 110 as shown in FIG. 2C. Later, the first substrate 100 and the spacer 120 are connected together accordingly. More specifically speaking, an image sensor is focused on the region between the first substrate 100 and the spacer 120. For example, the image sensor is a charge couple device (CCD). Then, the relative positions of the first substrate 100 and the spacer 120 are adjusted, so that the optical devices 110 are positioned correspondingly to the apertures 125. FIG. 2D illustrate the first substrate 100 and the spacer 120 in FIG. 2C along a cross-sectional line 2D-2D'. Please referring to FIG. 2D, the apertures 120 of the spacer 125 face the optical devices 110. As a result, the optical devices 110 are positioned in the recessed formed between the spacer 120 and the first substrate 100. Afterwards, the relative positions of the spacer 120 and the first substrate 100 are adjusted slightly. The first patterns 102 and 104 are aimed at the through holes 122 and 124 through the image sensor, as shown in FIG. 2C. In other words, when the image sensor detects the first patterns 102 and 104 through the through holes 122 and 124 respectively, the first substrate 100 and the spacer 120 are positioned correctly. After, the first substrate 100 and the spacer 120 are pressed together.

Figure 2E:
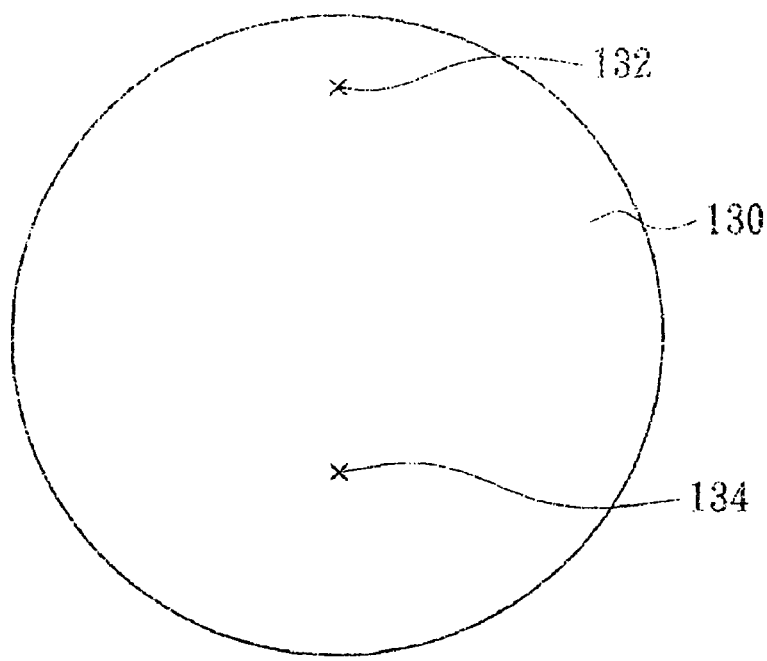
Figure 2F:
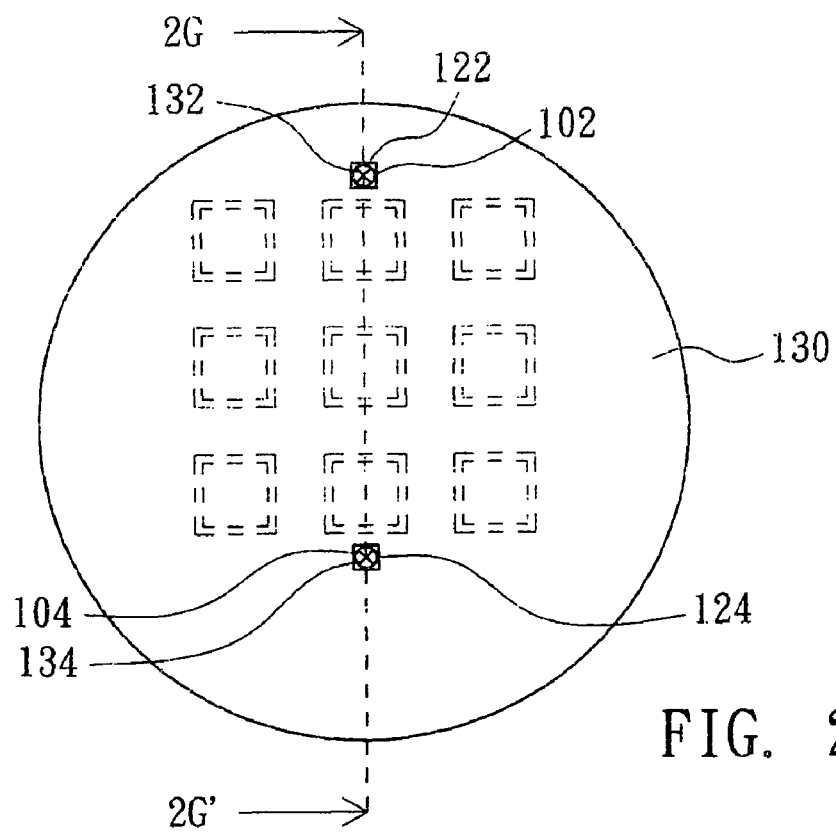
Figure 2G:
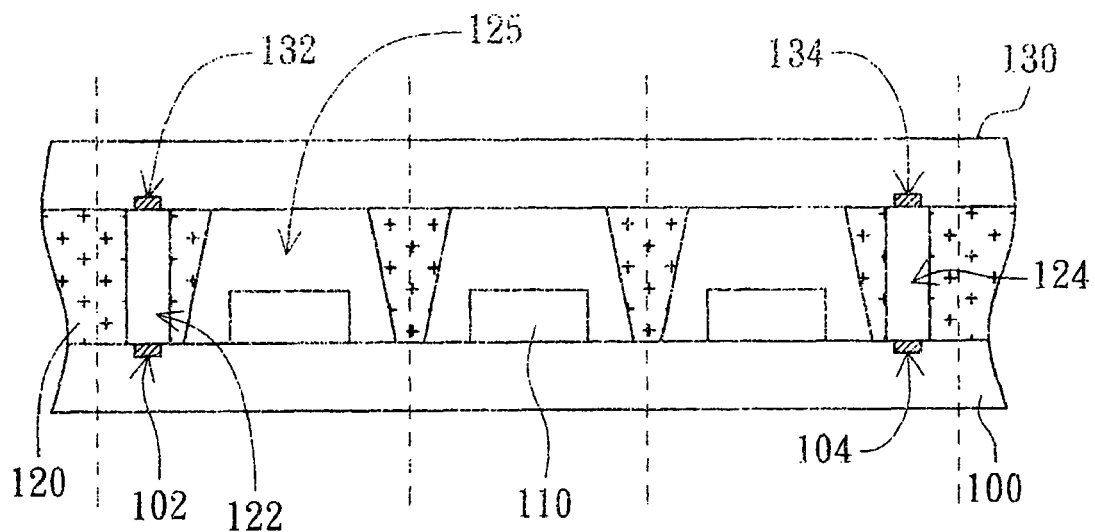

Subsequently, a second substrate 130, such as a glass substrate is provided. The second substrate 130 includes at least one pattern. For example, the second substrate 130 includes two second patterns 132 and 134, as shown in FIG. 2E. The second substrate 130 is preferably a glass wafer. Then, the second patterns 132 and 134 are aimed at the through holes 122 and 124 to connect the spacer 120 and the second substrate 130 accordingly, as shown in FIG. 2F. Practically, the image sensor is focused on the region between the spacer 120 and the second substrate 130. Then, the relative positions of the spacer 120 and the second substrate 130 are adjusted. Meanwhile, the second patterns 132 and 134 are aimed at the through holes 122 and 124 through the image sensor, as shown in FIG. 2F. In other words, when the image sensor detects the second patterns 132 and 134 through the through holes 122 and 124 respectively, the spacer 120 and the second substrate 130 are positioned correctly. Then, the spacer 120 and the second substrate 130 are pressed together. FIG. 2G illustrates a package in FIG. 2F along a cross-sectional line 2G-2G'. Please referring to FIG. 2G, the spacer 120 is disposed on the first substrate 100. The apertures 125 of the spacer 120 are aimed at the optical devices 110. The second substrate 130 is disposed on the spacer 120.

Furthermore, the first substrate, the spacer and the second substrate can be placed over one another first and then be positioned. As long as the image sensor is focused on the region between the first substrate and the spacer, or the region between the spacer and the second substrate, the first substrate, the spacer and the second substrate can be positioned respectively to achieve the same result.

Figure 2H:
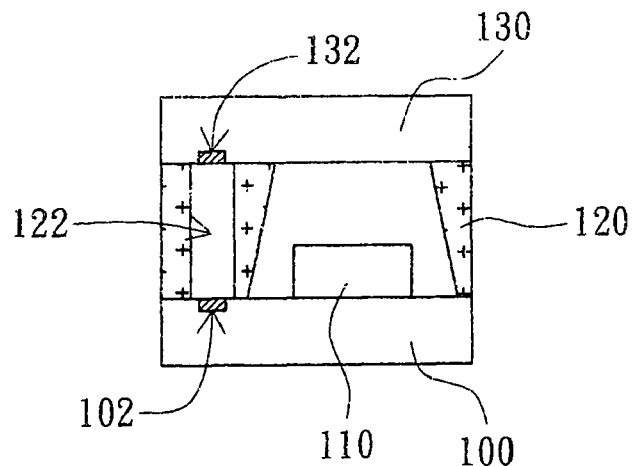

Later, the connected first substrate, the spacer and the second substrate are cut to form several optical packages, as shown in FIG. 2H. Accordingly, the optical devices are packaged. The semiconductor package structure manufactured according to the above method includes the first substrate 100, the optical device 110, the spacer 120 and the second substrate 130. The first substrate 100 includes the first pattern 102. The optical device 110 is disposed on the first substrate 100. The spacer 120 is connected to the first substrate 100 and has the aperture 125 and the through hole 122. The aperture 125 is aimed at the optical device 110. The first pattern 102 is aimed at the through hole 125. The second substrate 130 is connected to the spacer 120 and has the second pattern 132 corresponding to the through hole 122. As a result, the optical device 110, such as a DMD chip, reflects or refracts light incident through the second substrate 130.

Moreover, the first substrate 100 is preferably a CMOS wafer. The spacer 120 is preferably formed by etching a wafer. The second substrate 130 is preferably a glass wafer. As a result, the steps including placing the substrates, etching the spacers, placing the glass substrates and positioning are all performed on the conventional packaging machine.

In the above embodiment of the invention, the method for packaging a semiconductor device and the package structure thereof improve the problem that the first substrate, the spacer and the second substrate cannot be positioned through the image sensor. The spacer is disposed between the first substrate and the second substrate to form a gap, so that semiconductor device, such as an optical device is disposed within the gap. In the present embodiment, through holes are formed in the spacer, and corresponding patterns are formed on the first substrate and the second substrate. As a result, the image sensor receives light through the second substrate and the through holes to position the first substrate, the spacer and the second substrate. The positioning process is accomplished by the conventional machines. Therefore, there is no need to purchase new machines. Furthermore, the semiconductor device is positioned accurately through the method of the invention, so that the following manufacturing process is controlled correctly to increase the yield.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for packaging an semiconductor device, the method comprising:

providing a first substrate, at least one semiconductor device disposed on a surface of the first substrate, the first substrate comprising at least one first pattern;

providing a spacer with at least one aperture and at least one through hole, wherein the through hole is smaller than the aperture;

connecting the first substrate and the spacer by aiming the first pattern at the through hole, so that the semiconductor device is positioned correspondingly to the aperture;

providing a second substrate comprising at least one second pattern; and connecting the spacer and the second substrate by aiming the second pattern at the through hole.

2. The method according to claim 1, wherein the step of providing the spacer further comprises:

providing a wafer;

forming a patterned photoresist layer over the wafer; and etching the wafer to form at least one aperture and at least one through hole according to the patterned photoresist layer.

3. The method according to claim 1, wherein the step of connecting the first substrate and the spacer further comprises:

focusing an image sensor on the region between the first substrate and the spacer;

adjusting the relative position of the first substrate and the spacer, so that the semiconductor device is disposed correspondingly to the aperture;

aiming the first pattern at the through hole by the image sensor; and pressing the first substrate and the spacer to connect.

4. The method according to claim 3, wherein the image sensor is a charge coupled device (CCD).

5. The method according to claim 1, wherein the step of connecting the spacer and the second substrate further comprises:
focusing an image sensor at the region between the spacer and the second substrate;
adjusting the relative positions of the spacer and the second substrate;
aiming the second pattern at the through hole by the image sensor; and
pressing the spacer and the second substrate to connect.

6. The method according to claim 1, further comprising:
cutting the connected first substrate, the spacer and the second substrate to form a plurality of optical packages.

7. The method according to claim 1, wherein the semiconductor device is an optical device.

8. The method according to claim 1, wherein the second substrate is a glass substrate.

9. The method according to claim 1, wherein in the steps of providing the first substrate and providing the spacer, the through hole is smaller than the semiconductor device.

10. The method according to claim 1, wherein in the steps of providing the first substrate and providing the spacer, a plurality of semiconductor devices are disposed on the surface of the first substrate, the spacer has a plurality of apertures, and the quantity of the at least one through hole is less than the quantity of the apertures.

11. The method according to claim 1, wherein in the steps of providing the first substrate and providing the spacer, a plurality of semiconductor devices are disposed on the surface of the first substrate, and the quantity of the at least one through hole is less than the quantity of the semiconductor devices.

12. The method according to claim 1, wherein in the steps of providing the spacer, the aperture is disposed at a central area of the spacer, and the through hole is disposed at a marginal area of the spacer.

13. An semiconductor package, comprising:
a first substrate comprising at least one first pattern;
at least one semiconductor device disposed on the first substrate;
a spacer with at least one aperture and at least one through hole, the through hole being smaller than the aperture, the spacer connected to the first substrate, the aperture aimed at the semiconductor device, the first pattern aimed at the through hole; and
a second substrate disposed on the spacer, the second substrate comprising a second pattern corresponding to the through hole.

14. The semiconductor package according to claim 13, wherein the semiconductor device is an optical device.

15. The semiconductor package according to claim 13, wherein the second substrate is a glass substrate.

16. The semiconductor package according to claim 13, wherein the through hole is smaller than the semiconductor device.

17. The semiconductor package according to claim 13, wherein a plurality of semiconductor devices are disposed on the surface of the first substrate, the spacer has a plurality of apertures, and the quantity of the at least one through hole is less than the quantity of the apertures.

18. The semiconductor package according to claim 13, wherein a plurality of semiconductor devices are disposed on the surface of the first substrate, and the quantity of the at least one through hole is less than the quantity of the semiconductor devices.

19. The semiconductor package according to claim 13, wherein the aperture is disposed at a central area of the spacer, and the through hole is disposed at a marginal area of the spacer.

20. The semiconductor package according to claim 13, wherein a cross-section of the through hole is a rectangle.

* * * * *